United States Patent
Fu et al.

(10) Patent No.: US 6,426,272 B1
(45) Date of Patent: Jul. 30, 2002

(54) METHOD TO REDUCE STI HDP-CVD USG DEPOSITION INDUCED DEFECTS

(75) Inventors: Chu-Yun Fu, Taipei; Li-Jen Chen, Kaohsiung, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/960,808

(22) Filed: Sep. 24, 2001

(51) Int. Cl.[7] .............................................. H01L 21/76
(52) U.S. Cl. ...................................... 438/435; 438/437
(58) Field of Search ................................ 438/424, 435, 438/437

(56) References Cited

U.S. PATENT DOCUMENTS

| | | | | |
|---|---|---|---|---|
| 5,897,361 A | * | 4/1999 | Egawa ........................ | 438/435 |
| 6,140,208 A | * | 10/2000 | Agahi et al. ................. | 438/437 |
| 6,146,971 A | | 11/2000 | Chen et al. .................. | 438/424 |
| 6,146,974 A | | 11/2000 | Liu et al. ..................... | 438/435 |
| 6,153,479 A | | 11/2000 | Liao et al. ................... | 438/296 |
| 6,165,854 A | | 12/2000 | Wu .............................. | 438/296 |
| 6,200,881 B1 | * | 3/2001 | Lou ............................. | 438/424 |
| 6,255,176 B1 | * | 7/2001 | Kim et al. .................... | 438/296 |
| 6,255,194 B1 | * | 7/2001 | Hong ........................... | 438/424 |
| 6,297,128 B1 | * | 10/2001 | Kim et al. .................... | 438/437 |
| 6,326,282 B1 | * | 12/2001 | Park et al. ................... | 438/424 |
| 6,331,472 B1 | * | 12/2001 | Liu et al. ..................... | 438/424 |
| 6,358,796 B1 | * | 3/2002 | Lin et al. ..................... | 438/257 |

* cited by examiner

*Primary Examiner*—Olik Chaudhuri
*Assistant Examiner*—David S Blum
(74) *Attorney, Agent, or Firm*—George O. Saile; Stephen B. Ackerman; Rosemary L. S. Pike

(57) ABSTRACT

A method for shallow trench isolation formation having a thick un-biased HDP USG liner layer to reduce HDP-CVD induced defects is described. Trenches are etched through an etch stop layer into a semiconductor substrate. The semiconductor substrate is thermally oxidized to form a thermal liner layer within the isolation trenches. The isolation trenches are filled using a high density plasma chemical vapor deposition process (HDP-CVD) having a deposition component and a sputtering component wherein the HDP-CVD process comprises: first depositing a first liner layer overlying the thermal liner layer wherein no bias power is supplied during the first depositing step and wherein the first liner layer has a thickness of between 200 and 400 Angstroms, second depositing a second liner layer using low bias power, and third depositing a gap filling layer overlying the second liner layer to fill the isolation trenches. The gap filling layer is polished back overlying the etch stop layer. The etch stop layer is removed to complete planarized shallow trench isolation regions in the manufacture of an integrated circuit device.

26 Claims, 3 Drawing Sheets

US 6,426,272 B1

METHOD TO REDUCE STI HDP-CVD USG DEPOSITION INDUCED DEFECTS

BACKGROUND OF THE INVENTION (1) Field of the Invention

The present invention relates to the fabrication of integrated circuit devices, and more particularly, to a method of reducing defects in HDP-CVD deposition in the formation of shallow trench isolation in the fabrication of integrated circuits.

(2) Description of the Prior Art

In the fabrication of integrated circuit devices, shallow trench isolation (STI) is often used to isolate active areas from one another. High density plasma chemical vapor deposition (HDP-CVD) of undoped silicate glass (USG) has been used for STI gap fill for 0.25 $\mu$m generation and beyond. The HDP-CVD process includes a deposition component and a sputtering component. In an HDP plasma process, the dielectric material is deposited and etched simultaneously in the same reaction. This process causes the material to be deposited very densely and with no voids. In addition, the etching process causes the HDP material to assume a near 45 degree angle profile at trench corners. In addition, a densification step is performed.

U.S. Pat. No. 6,165,854 to Wu discloses a thermal oxide liner formed to recover silicon damage during etching. U.S. Pat. No. 6,146,971 to Chen et al teaches a thermal oxide liner having a thickness of 100 to 150 Angstroms. U.S. Pat. No. 6,153,479 to Liao et al also shows a thermal oxide liner. U.S. Pat. No. 6,146,974 to Liu et al forms a thermal oxide liner, followed by an un-biased unclamped HDP oxide liner layer, and then an HDP oxide gap filling layer.

SUMMARY OF THE INVENTION

Accordingly, it is a primary object of the present invention to provide an effective and very manufacturable method for forming shallow trench isolation regions in the fabrication of integrated circuits.

It is a further object of the invention to provide a shallow trench isolation process where HDP-CVD induced defects are reduced.

Yet another object is to provide a method for shallow trench isolation formation having a thick un-biased HDP USG liner layer to reduce HDP-CVD induced defects.

In accordance with the objects of the invention, a method for shallow trench isolation formation having a thick un-biased HDP USG liner layer to reduce HDP-CVD induced defects is achieved. Trenches are etched through an etch stop layer into a semiconductor substrate. The semiconductor substrate is thermally oxidized to form a thermal oxide liner layer within the isolation trenches. The isolation trenches are filled using a high density plasma chemical vapor deposition process (HDP-CVD) having a deposition component and a sputtering component wherein the HDP-CVD process comprises: first depositing a first liner layer overlying the thermal oxide liner layer wherein no bias power is supplied during the first depositing step and wherein the first liner layer has a thickness of between 250 and 350 Angstroms, second depositing a second liner layer overlying the first liner layer wherein a low bias is supplied during the second depositing step, and third depositing a gap filling layer overlying the second liner layer to fill the isolation trenches. The gap filling layer is polished back overlying the etch stop layer. The etch stop layer is removed to complete planarized shallow trench isolation regions in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention forms shallow trench isolation having greatly reduced HDP-CVD induced defects and consequently, higher yields.

Figure 1:
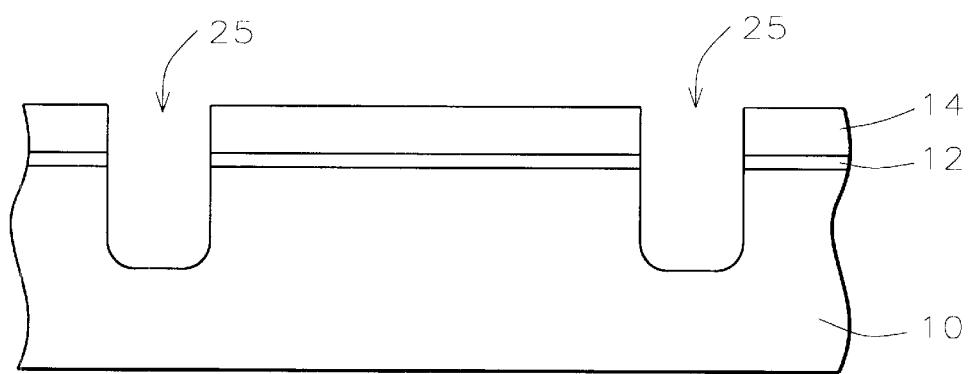
FIGS. 1 through 6 are cross-sectional representations of a preferred embodiment of the present invention.

Referring now more particularly to FIG. 1, there is shown a semiconductor substrate 10, preferably composed of monocrystalline silicon. Shallow trench isolation (STI) regions are now to be formed. For example, a stacked film hard mask structure is deposited. A pad oxide layer 12 may be grown on the surface of the semiconductor substrate. Then, a silicon nitride layer 14 may be deposited overlying the pad oxide layer. Now, the hard mask film stack is patterned to provide openings where shallow trench isolation regions are to be formed. Etching continues into the semiconductor substrate to form trenches 25, as shown in FIG. 1.

Figure 2:
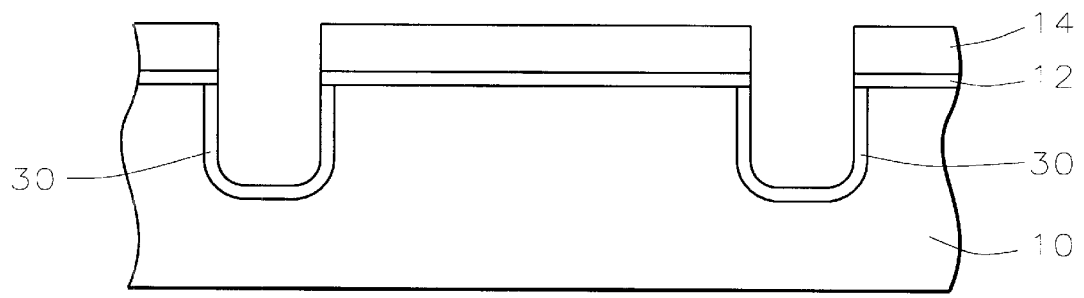

Now, thermal oxidation is performed, for example in a furnace, to form the thermal oxide layer 30 surrounding the isolation trenches 25, as shown in FIG. 2.

In a HDP-CVD USG gap fill process, a first thin liner layer is deposited using un-biased source radio frequency (RF). The source RF is used for generating radicals in the HDP process. A second liner layer is deposited using biased RF of less than 1500 watts. The bias RF provides sputtering in the HDP process. Together the two liner layers have a thickness of about 200 Angstroms. Finally, the main deposition of the gap fill layer often uses a high biased RF of 2500 to 3500 watts. For a 0.13 $\mu$m device, the first thin in-situ un-biased liner layer is about 50 Angstroms thick and the second low biased liner layer is about 150 Angstroms. However, high killer defects were caused by this deposition process, resulting in about a 10% yield reduction. The mechanism is thought to be due to the thin un-biased liner layer of 50 Angstroms. It is thought that this liner layer was too thin to protect the furnace liner oxide (underlying the first liner layer), the nitride hard mask, and the silicon substrate from being damaged by sputtering during the subsequent main deposition step. The sputtered species were seen to react somehow to form particles as large as 5 to 6 $\mu$m, preventing the HDP USG from filling the gap and thus resulting in killer defects.

Figure 3:
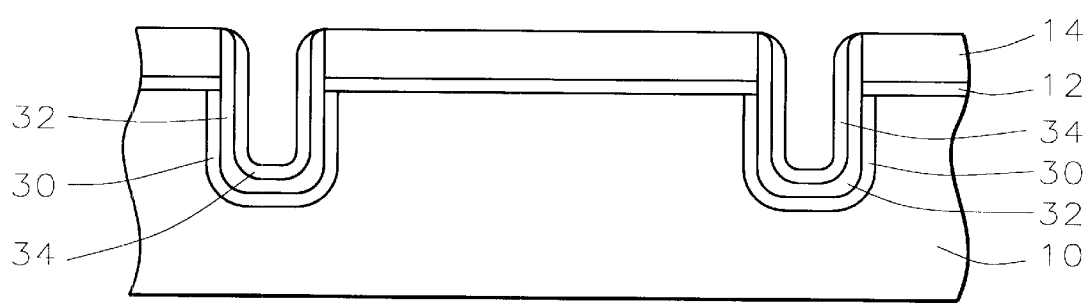

The inventors have invented a novel HDP-CVD gap fill process that has been successful in greatly reducing HDP-CVD-induced defects. Referring now to FIG. 3, the key HDP-CVD process of the present invention will be described. In a first step, a first liner layer 32 is deposited conformally within the isolation trenches. The first liner layer overlies the thermal liner layer 30 within the trenches. The first liner layer 32 is deposited to a thickness of between about 200 and 400 Angstroms. The first liner layer 32 is in-situ deposited undoped silicate glass (USG) deposited using no bias RF. Source RF is used only. If the liner layer 32 is thinner than 200 Angstroms, it will not provide enough sputter protection. If it is thicker than 400 Angstroms, it will prevent good gap filling for future technologies of 0.13 $\mu$m and below.

Now, in a second step, a second liner layer 34 is deposited over the first liner layer 32. The second liner layer 34, also comprising USG, is deposited using a low bias RF of between about 1000 and 2000 watts to a thickness of between about 100 and 200 Angstroms. The bias RF provides sputtering in the HDP process, leaving room for good gap fill with no overhang. The thickness of the combined first and second liner layers is between about 300 and 600 Angstroms.

Figure 4:
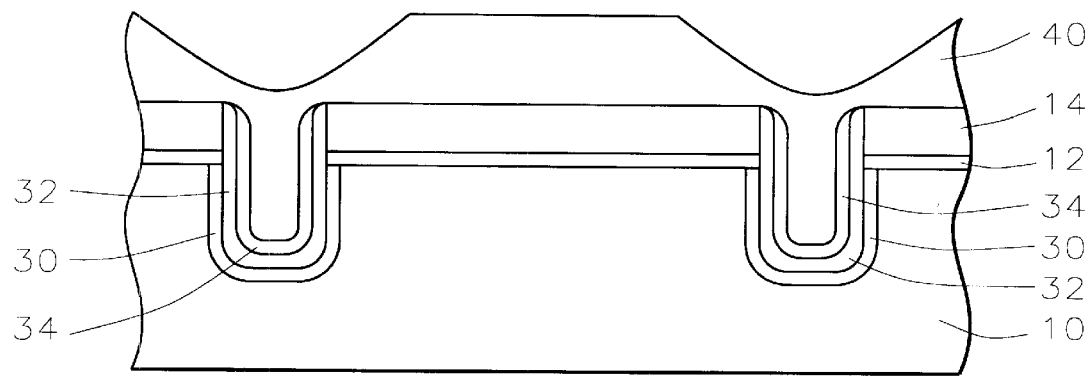

Now, in the third step of the HDP-CVD process illustrated in FIG. 4, the STI trenches are filled with a gap-filling USG layer 40. This is the main deposition step of the HDP-CVD process and is performed with a bias power of between about 2000 and 3500 watts. The thicker first liner layer 32 protects the thermal liner layer 30, the etch stop layer 14, and the silicon substrate 10 from sputtering during the main HDP deposition step.

The process of the invention has been implemented experimentally. It has been found that the yield reduction caused by deposition induced defects is greatly improved. For example, in experiments using a combined liner layer thickness of 200 Angstroms, 14 and 16 killer defects were detected. In experiments using the liner layer of the present invention having a first layer of 350 Angstroms and a second layer of 150 Angstroms, 1 or 2 killer defects were found. Furthermore, the gap fill for the deposition process of the present invention using a thick un-biased liner layer is not degraded as compared to a process using a thin un-biased liner layer.

Figure 5:
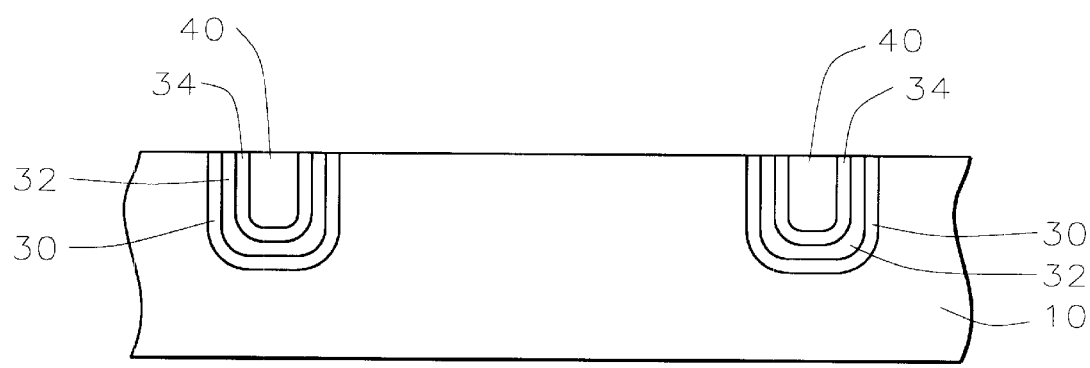

Processing continues as conventional in the art. The gap fill layer 40 is polished back, for example by chemical mechanical polishing (CMP), with a polish stop at the silicon nitride layer 14. The silicon nitride layer 14 is stripped, using, for example, hot phosphoric acid ($H_3PO_4$). This completes the STI regions having an oxide liner layer 30, USG liner layers 32 and 34, and USG fill layer 40, as shown in FIG. 5.

Figure 6:
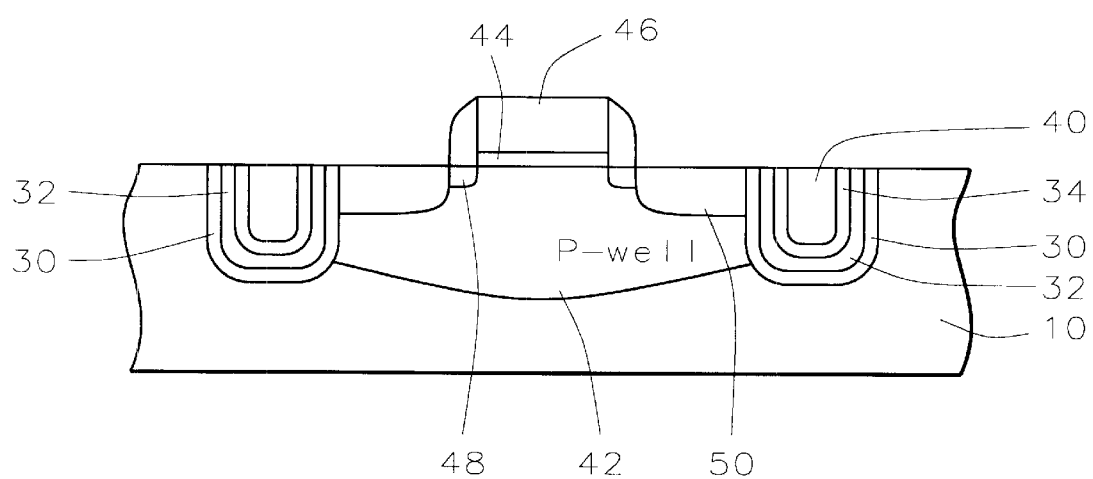

Now, referring to FIG. 6, semiconductor devices are formed, as is conventional in the art. For example, FIG. 8 shows P-well 42 formed in the substrate, polysilicon gate electrode 46 overlying gate oxide 44 formed on the surface of the substrate, lightly doped source and drain regions 48, and heavily doped source and drain regions 50. It will be understood that the P-well could be an N-well and N+ or P+ regions could be formed. It has been found that gate oxide integrity for the N-well and P-well is not affected by the increase in liner thickness of the present invention.

The process of the present invention employs a thick un-biased liner layer formed in-situ in a HDP-CVD USG gap filling process to form STI regions. The un-biased liner layer should have a thickness of between about 200 and 400 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation regions in the manufacture of an integrated circuit device comprising:
   etching a plurality of isolation trenches into a semiconductor substrate;
   forming an oxide liner layer within said isolation trenches; and
   filling said isolation trenches using a high density plasma chemical vapor deposition process (HDP-CVD) wherein said HDP-CVD process comprises:
      first depositing a first liner layer overlying said oxide liner layer wherein no bias power is supplied during said first depositing step;
      second depositing a second liner layer overlying said first liner layer wherein low bias power is supplied during said second depositing step; and
      third depositing a gap filling layer overlying said second liner layer to fill said isolation trenches.

2. The method according to claim 1 further comprising growing a pad oxide layer on said semiconductor substrate; and
   depositing an etch stop layer overlying said pad oxide layer wherein said plurality of isolation trenches are etched through said etch stop layer and said pad oxide layer and into said semiconductor substrate.

3. The method according to claim 2 wherein said etch stop layer comprises silicon nitride.

4. The method according to claim 1 wherein said first liner layer comprises undoped silicate glass having a thickness of between about 200 and 400 Angstroms.

5. The method according to claim 1 wherein said second liner layer comprises undoped silicate glass having a thickness of between about 100 and 200 Angstroms.

6. The method according to claim 1 wherein said low bias power is between about 1000 and 2000 watts.

7. The method according to claim 1 wherein said step of polishing back said gap filling layer comprises chemical mechanical polishing.

8. The method according to claim 2 after said step of polishing back said gap filling layer further comprising removing said etch stop layer using a hot phosphoric acid ($H_3PO_4$) dip.

9. The method according to claim 1 wherein a combined thickness of said first and second liner layers is between about 300 and 600 Angstroms.

10. A method of forming shallow trench isolation regions in the manufacture of an integrated circuit device comprising:
    depositing an etch stop layer on the surface of a semiconductor substrate;
    etching a plurality of isolation trenches through said etch stop layer into said semiconductor substrate;
    thermally oxidizing said semiconductor substrate to form a thermal liner layer within said isolation trenches;
    filling said isolation trenches using a high density plasma chemical vapor deposition process (HDP-CVD) having a deposition component and a sputtering component wherein said HDP-CVD process comprises:
       first depositing a first liner layer overlying said thermal liner layer wherein no bias power is supplied during said first depositing step and wherein said first liner layer has a thickness of between 200 and 400 Angstroms;
       second depositing a second liner layer overlying said first liner layer wherein low bias power is supplied during said second depositing step; and
       third depositing a gap filling layer overlying said second liner layer to fill said isolation trenches;
    polishing back said gap filling layer overlying said etch stop layer; and
    removing said etch stop layer to complete planarized said shallow trench isolation regions in said manufacture of said integrated circuit device.

11. The method according to claim 10 further comprising growing a pad oxide layer on said semiconductor substrate before said step of depositing said etch stop layer.

12. The method according to claim 10 wherein said etch stop layer comprises silicon nitride.

13. The method according to claim 10 wherein said first liner layer comprises undoped silicate glass.

14. The method according to claim 10 wherein said second liner layer comprises undoped silicate glass layer having a thickness of between about 100 and 200 Angstroms.

15. The method according to claim 10 wherein said low bias power is between about 1000 and 2000 watts.

16. The method according to claim 10 wherein said step of polishing back said gap filling layer comprises chemical mechanical polishing.

17. The method according to claim 10 wherein said step of removing said etch stop layer comprises a hot phosphoric acid ($H_3PO_4$) dip.

18. The method according to claim 10 wherein a combined thickness of said first and second liner layers is between about 300 and 600 Angstroms.

19. A method of forming shallow trench isolation regions in the manufacture of an integrated circuit device comprising:

depositing an etch stop layer on the surface of a semiconductor substrate;

etching a plurality of isolation trenches through said etch stop layer into said semiconductor substrate;

thermally oxidizing said semiconductor substrate to form a thermal liner layer within said isolation trenches;

filling said isolation trenches with an undoped silicate glass layer using a high density plasma chemical vapor deposition process (HDP-CVD) having a deposition component and a sputtering component wherein said HDP-CVD process comprises:

first depositing a first liner layer overlying said thermal liner layer wherein no bias power is supplied during said first depositing step and wherein said first liner layer has a thickness of between 200 and 400 Angstroms;

second depositing a second liner layer overlying said first liner layer wherein low bias power is supplied during said second depositing step; and third depositing a gap filling layer overlying said second liner layer to fill said isolation trenches;

polishing back said gap filling layer overlying said etch stop layer; and removing said etch stop layer to complete planarized said shallow trench isolation regions in said manufacture of said integrated circuit device.

20. The method according to claim 19 further comprising growing a pad oxide layer on said semiconductor substrate before said step of depositing said etch stop layer.

21. The method according to claim 19 wherein said etch stop layer comprises silicon nitride.

22. The method according to claim 19 wherein said second liner layer has a thickness of between about 100 and 200 Angstroms.

23. The method according to claim 19 wherein said low bias power is between about 1000 and 2000 watts.

24. The method according to claim 19 wherein said step of polishing back said gap filling layer comprises chemical mechanical polishing.

25. The method according to claim 19 wherein said step of removing said etch stop layer comprises a hot phosphoric acid ($H_3PO_4$) dip.

26. The method according to claim 19 wherein a combined thickness of said first and second liner layers is between about 300 and 600 Angstroms.

* * * * *